United States Patent [19]
Nakamura et al.

[11] Patent Number: 5,793,601
[45] Date of Patent: Aug. 11, 1998

[54] COMPOSITE FUCTIONAL DEVICE AND METHOD FOR PRODUCING THE SAME

[75] Inventors: Kazutaka Nakamura; Kazuhiro Kaneko, both of Shiga-ken, Japan

[73] Assignee: Murata Manufacturing Co., Ltd., Kyoto-fu, Japan

[21] Appl. No.: 786,754

[22] Filed: Jan. 24, 1997

[30] Foreign Application Priority Data

Jan. 25, 1996 [JP] Japan .................................. 8-011040

[51] Int. Cl.⁶ .................................................. H01G 4/06
[52] U.S. Cl. .................. 361/321.4; 361/322; 361/321.5
[58] Field of Search .......................... 361/306.3, 311, 361/312, 313, 320, 321.1, 321.2, 321.5, 322; 333/184, 185, 186; 428/692; 252/62.56; 336/84 M, 87; 29/25.41, 25.42

[56] References Cited

U.S. PATENT DOCUMENTS

| | | | |
|---|---|---|---|
| 4,956,114 | 9/1990 | Watanabe et al. | 252/62.58 |
| 5,206,620 | 4/1993 | Watanabe et al. | 336/84 M |
| 5,304,318 | 4/1994 | Watanabe et al. | 252/62.61 |
| 5,415,945 | 5/1995 | Azumi et al. | 428/692 |
| 5,450,278 | 9/1995 | Lee et al. | 361/303 |
| 5,476,728 | 12/1995 | Nakano et al. | 428/692 |
| 5,592,134 | 1/1997 | Ogata et al. | 333/185 |

*Primary Examiner*—Bot L. Ledynh
*Assistant Examiner*—Anthony Dinkins
*Attorney, Agent, or Firm*—Ostrolenk, Faber, Gerb & Soffen, LLP

[57] ABSTRACT

A composite functional device is provided. The device includes a magnetic ceramic including an Ni—Zn ferrite; and a semiconductive including zinc oxide and an oxide of at least one of nickel and iron in an amount of from about 0.001 to 0.1 mol % in terms of NiO or $Fe_2O_3$.

19 Claims, 2 Drawing Sheets

COMPOSITE FUCTIONAL DEVICE AND METHOD FOR PRODUCING THE SAME

FIELD OF THE INVENTION

The present invention relates to a small-sized, composite functional device with varistor characteristics, capacitor characteristics and magnetic characteristics, and to a method for producing it.

BACKGROUND OF THE INVENTION

For current electronic instruments, it is important to prevent integrated circuits and other semiconductor devices from malfunctioning and breaking down due to noise, and also to prevent propagation of noise to the exterior of the electronic instruments. To accomplish this, varistor chips, capacitor chips and ferrite chips are mounted on electronic circuit boards. However, the mounting of a large number of such devices on circuit boards results in an increase in the total area occupied by circuit boards in the electronic instruments and even in an increase in the cost of the electronic instruments. Therefore, composite devices for preventing noise are desired.

One method of meeting the above-mentioned requirement is to provide a composite functional device by integrally sintering a magnetic ceramic composition and a semiconductive ceramic composition with varistor characteristics. In order to produce such a composite functional device, however, the interaction between compositions of different materials that occurs during integral sintering should be restricted to such a degree that a negative influence on the characteristics of the device is avoided.

For example, integrally sintering a semiconductive ceramic composition with varistor characteristics and a magnetic ceramic composition can result in the compositions mutually diffusing into each other. Where the semiconductive ceramic composition comprises ZnO and the magnetic ceramic composition comprises a Ni—Zn ferrite, Ni and Fe compounds diffuse into the varistor material. The diffusion of Ni and Fe compounds results in deterioration of both the varistor characteristics and the capacitor characteristics of the semiconductive ceramic composition. As a result of the diffusion, the linearity for the varistor characteristics is lowered and the dielectric loss for the capacitor characteristics is increased.

SUMMARY OF THE INVENTION

Accordingly, the object of the present invention is to provide a noise-preventing, composite functional device with good varistor characteristics and good capacitor characteristics which comprises an integrally sintered body composed of a magnetic ceramic and a semiconductive ceramic and in which diffusion of the components constituting the magnetic ceramic into the semiconductive ceramic is retarded or prevented, and also to provide a method for producing the device.

To attain the above-mentioned object, the present invention provides a composite functional device prepared by integrally sintering a magnetic ceramic consisting essentially of an Ni—Zn ferrite, and a semiconductive ceramic with varistor characteristics consisting essentially of zinc oxide and containing an oxide of at least one of nickel and iron in an amount of from about 0.001 to 0.1 mol % in terms of NiO or $Fe_2O_3$, and preferably about 0.005 to 0.5 mol %, based on the mols of zinc oxide.

The present invention also provides a method for producing such a composite functional device comprising combining a shaped body of a magnetic material that consists essentially of an Ni—Zn ferrite and a shaped body of a semiconductive material with varistor characteristics that consists essentially of zinc oxide and an oxide of at least one of nickel and iron in an amount of from about 0.001 to 0.1 mol % in terms of NiO or $Fe_2O_3$, followed by integrally sintering the combination.

Thus, it is possible, according to the present invention, to prevent the components constituting the magnetic ceramic from diffusing into the semiconductive ceramic during sintering, and is therefore possible to obtain a composite functional device with good varistor characteristics and good capacitor characteristics.

PREFERRED MODES OF CARRYING OUT THE INVENTION

Embodiments of the composite functional device of the present invention are described below with reference to the drawings.

Figure 1:
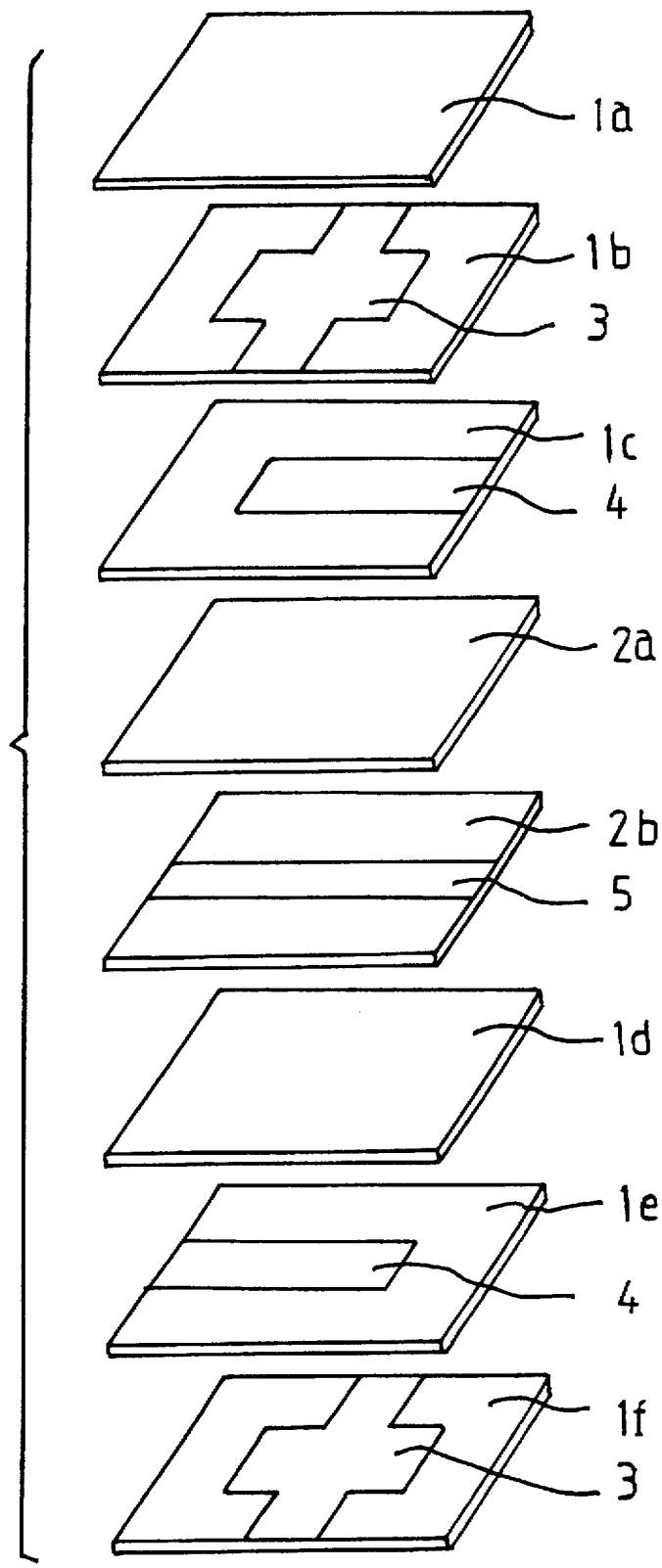
FIG. 1 is a perspective, exploded view illustrating the lamination of green sheets prior to baking, which constitute one embodiment of the composite functional device of the present invention.
Figure 2:
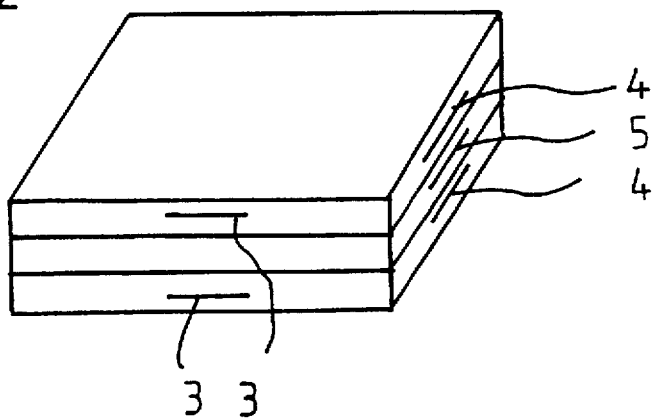
FIG. 2 is a perspective view illustrating the laminate of green sheets of FIG. 1 prior to baking, which is for the composite functional device of the present invention.
Figure 3:
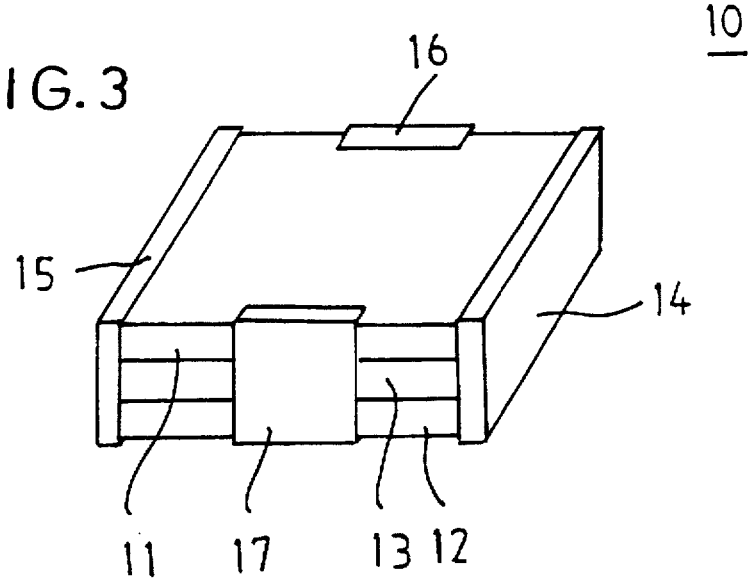
FIG. 3 is a perspective view illustrating a composite functional device that comprises the sintered laminate illustrated in FIG. 1 and FIG. 2.

With reference to FIG. 1 and FIG. 2, the method for producing the composite functional device 10 of FIG. 3 is described below. In FIG. 3, 11 and 12 are semiconductive ceramic sheets; 13 is a magnetic ceramic sheet; 14 and 15 are terminal electrodes for the source of potential; and 16 and 17 are terminal electrodes for the ground.

First prepared were green sheets 1a, 1b, 1c, 1d, 1e and 1f comprising a varistor material, that is, a semiconductive material.

More precisely, prepared were raw material powders of ZnO, $Bi_2O_3$, $CoCO_3$, $MnO_2$ and $Sb_2O_3$ all having a purity of not lower than 99%. These were weighed in proportions of 98 mol % of ZnO, 0.5 mol % of $Bi_2O_3$, 0.5 mol % of $CoCo_3$, 0.5 mol % of $MnO_2$ and 0.5 mol % of $Sb_2O_3$, and mixed. To the mixture was added 3% by weight of zinc borosilicate glass (Zn: 25 mol %, B: 40 mol %, Si: 35 mol %). Next, NiO and/or $Fe_2O_3$ were/was added thereto in amounts of from 0.001 to 1.0 mol %, as shown in Table 1.

TABLE 1

| Sample Number | Amount Added (mol %) | |
|---|---|---|
| | NiO | $Fe_2O_3$ |
| 1 | 0.001 | 0 |
| 2 | 0.005 | 0 |
| 3 | 0.01 | 0 |
| 4 | 0.05 | 0 |
| 5 | 0.1 | 0 |
| 6* | 0.5 | 0 |
| 7* | 1.0 | 0 |
| 8 | 0 | 0.001 |

TABLE 1-continued

| Sample Number | Amount Added (mol %) | |
|---|---|---|
| | NiO | Fe$_2$O$_3$ |
| 9 | 0 | 0.005 |
| 10 | 0 | 0.01 |
| 11 | 0 | 0.05 |
| 12 | 0 | 0.1 |
| 13* | 0 | 0.5 |
| 14* | 0 | 1.0 |
| 15 | 0.05 | 0.01 |
| 16 | 0.05 | 0.05 |
| 17 | 0.05 | 0.1 |
| 18* | 0.05 | 0.5 |
| 19 | 0.01 | 0.05 |
| 20 | 0.1 | 0.05 |
| 21* | 0.5 | 0.05 |
| 22* | Not added | |

The thus-prepared raw material mixture was next milled with pure water in a ball mill, dewatered, and thereafter calcined at 800° C. for 2 hours. The resulting calcinate was further milled with pure water in a ball mill, filtered and dried to obtain a raw material powder for a varistor.

The raw material powder was dispersed in a solvent along with an organic binder to prepare a slurry, which was then shaped into 50 μm-thick green sheets through doctor-blading. From these green sheets, rectangular sheets were stamped out having a predetermined size. Thus were obtained a plurality of green sheets each comprising the varistor material.

Next, on these green sheets 1b, 1c, 1e and 1f, formed were electrodes 3, 4, 4 and 3, respectively, through screen printing which used an electroconductive paste consisting essentially of silver and palladium (Ag/Pd=70/30, by weight). The electrode 3 is essentially cross-shaped in which the facing ends of one pair of legs individually reach the facing ends of the green sheet. The electrode 4 is essentially I-shaped with one end reaching one end of the green sheet.

Next prepared were green sheets 2a and 2b each comprising a ferrite material, that is, a magnetic material.

More precisely, prepared were raw material powders of Fe$_2$O$_3$, NiO and ZnO all having a purity of not lower than 99%. These were weighed in proportions of 47 mol % of Fe$_2$O$_3$, 30 mol % of NiO and 23 mol % of ZnO, and mixed. To the resultant mixture was added 3% by weight of zinc borosilicate glass (Zn: 25 mol %, B: 40 mol %, Si: 35 mol %). The thus-prepared raw material mixture was milled with pure water in a ball mill, filtered and dried. The resulting mixture was calcined at 800° C. for 2 hours. After this, the thus-prepared calcinate was roughly ground, combined with 0.1% by weight of Bi$_2$O$_3$ and 3% by weight of zinc borosilicate glass (this is the same as that used hereinabove for the preparation of the raw material powder for the varistor). The resulting mixture was further milled with pure water in a ball mill for 24 hours, and then filtered and dried to obtain a raw material powder for a ferrite.

The raw material powder was next dispersed in a solvent along with an organic binder to prepare a slurry, which was then shaped into 50 μm-thick green sheets through doctor-blading. From these green sheets, rectangular sheets of predetermined size were stamped out. Thus were obtained a plurality of green sheets each comprising the ferrite material.

On the green sheet 2b was formed an electrode 5 through screen printing an electroconductive paste consisting essentially of silver and palladium (Ag/Pd=70/30, by weight). The electrode 5 is essentially I-shaped with both ends reaching the facing ends of the green sheet.

Next, as shown in FIG. 1, green sheet 1a, green sheet 1b with electrode 3, green sheet 1c with electrode 4, green sheet 2a, green sheet 2b with electrode 5, green sheet 1d, green sheet 1e with electrode 4, green sheet 1f with the electrode 3 were laminated together in that order starting from the top.

After this, the thus-laminated green sheets 1a, 1b, 1c, 2a, 2b, 1d, 1e and 1f were set in a pressing machine and pressed under a pressure of 2 tons/cm$^2$ to obtain the integrated laminate of FIG. 2.

Figure 4:
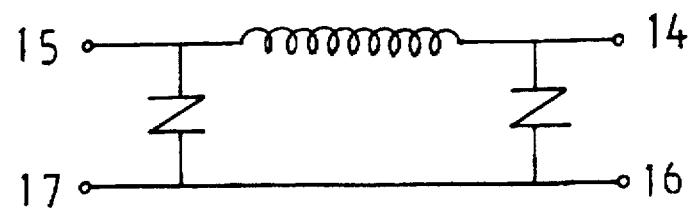
FIG. 4 shows the equivalent circuit of the composite functional device of FIG. 3.

The laminate was then baked at 950° C. for 2 hours. After this, using an electroconductive paste consisting essentially of silver, formed were terminal electrodes 14 and 15 for connection to a source of potential. These electrodes 14 and 15 were electrically connected with the exposed ends of the electrodes 4, 5 and 4. In the same manner, also formed were terminal electrodes 16 and 17 for the ground and were electrically connected with the ground electrodes 3 and 3. FIG. 4 shows the equivalent circuit of the composite functional device produced herein.

The characteristics of the composite functional device 10 thus obtained herein were measured. In particular, for the varistor part, measured were the varistor voltage (V$_{1mA}$), the non-linear coefficient (α), and also the capacitance and the dielectric loss under the conditions of 25° C., 1 kHz and 1 Vrms. For the ferrite part, measured were the inductance at 1 MHz and the impedance at 100 MHz. The data obtained are shown in Table 2, in which the samples marked with (*) are outside the scope of the present invention and the other samples are within the scope of the present invention.

TABLE 2

| Sample Number | Varistor Voltage, V$^{1mA}$ | Non-Linear Coefficient (α) | Capacitance (pF) | Dielectric Loss (%) | Inductance, 1 MHz(μ) | Impedance, 100 MHz (Ω) |
|---|---|---|---|---|---|---|
| 1 | 32.0 | 31.2 | 322 | 1.8 | 130 | 37 |
| 2 | 31.6 | 32.6 | 333 | 1.7 | 131 | 35 |
| 3 | 30.4 | 35.0 | 342 | 1.5 | 132 | 42 |
| 4 | 30.7 | 35.4 | 336 | 1.6 | 127 | 46 |
| 5 | 30.6 | 34.5 | 327 | 1.8 | 122 | 43 |
| 6* | 21.3 | 22.6 | 354 | 5.1 | 109 | 34 |
| 7* | 18.0 | 16.8 | 391 | 7.6 | 104 | 35 |
| 8 | 32.7 | 31.4 | 330 | 1.2 | 136 | 37 |
| 9 | 33.9 | 35.2 | 322 | 1.4 | 127 | 39 |
| 10 | 34.1 | 38.6 | 315 | 1.3 | 120 | 45 |
| 11 | 36.8 | 37.6 | 300 | 1.6 | 128 | 49 |
| 12 | 39.1 | 32.2 | 285 | 1.2 | 126 | 40 |

TABLE 2-continued

| Sample Number | Varistor Voltage, $V^{1mA}$ | Non-Linear Coefficient ($\alpha$) | Capacitance (pF) | Dielectric Loss (%) | Inductance, 1 MHz($\mu$) | Impedance, 100 MHz ($\Omega$) |
|---|---|---|---|---|---|---|
| 13* | 38.4 | 21.1 | 346 | 5.7 | 107 | 35 |
| 14* | 38.5 | 11.6 | 390 | 8.8 | 101 | 37 |
| 15 | 32.4 | 34.3 | 346 | 1.6 | 131 | 46 |
| 16 | 33.7 | 35.8 | 321 | 1.4 | 122 | 47 |
| 17 | 34.3 | 33.4 | 337 | 2.1 | 121 | 42 |
| 18* | 37.3 | 15.7 | 319 | 9.1 | 98 | 34 |
| 19 | 32.7 | 36.6 | 327 | 1.8 | 124 | 45 |
| 20 | 30.0 | 32.5 | 350 | 1.6 | 122 | 51 |
| 21* | 19.8 | 14.2 | 383 | 7.0 | 105 | 34 |
| 22* | 38.5 | 13.3 | 265 | 10.2 | 91 | 21 |

As shown in Table 2, the characteristics of the samples of the present invention in which the varistor comprises NiO and/or $Fe_2O_3$ are better than those of the sample No. 22 containing neither NiO nor $Fe_2O_3$ in that the non-linear coefficient ($\alpha$) of the former is large and in that the dielectric loss of the former is small. However, as seen in the samples Nos. 6, 7, 13, 14, 18 and 21, if the content of either one of NiO and $Fe_2O_3$ is larger than about 0.1 mol %, such is unfavorable since the varistor voltage ($V_{1mA}$) and the non-linear coefficient (a) are small and since the dielectric loss is large.

Regarding the characteristics of the ferrite, the addition of NiO and/or $Fe_2O_3$ to the varistor layer makes the components constituting the ferrite hard to diffuse into the varistor composition, resulting in an increase in the inductance and the impedance of the ferrite. However, as seen in the samples Nos. 6, 7, 13, 14, 18 and 21, if the amount of either one of NiO and $Fe_2O_3$ added is more than about 0.1 mol %, such is unfavorable since both the inductance and the impedance are lowered.

In the above-mentioned samples, the addition of NiO and/or $Fe_2O_3$ to the varistor composition resulted in no change in the degree of shrinkage of the sintered samples and neither delamination nor peeling which may be caused by the difference in the degree of shrinkage between the constitutive layers.

The composite functional device of the present invention is not limited to the examples mentioned hereinabove, but can be varied and modified within the scope and the spirit of the invention. For example, the number and the order of the green sheets to be laminated, the number and the shape of the varistor electrodes, the number and the shape of the coils, and the specific compositions of the ferrite and semiconductor can be suitably varied and modified.

As will be obvious from the above-mentioned description, it is possible to obtain according to the present invention, a noise-preventing, composite functional device with good varistor characteristics and good capacitor characteristics, since nickel oxide and/or iron oxide are/is previously added to the shaped body of a semiconductor material with varistor characteristics. The addition of the oxide prevents the nickel and iron compounds that exist in the magnetic material from diffusing into the semiconductive material during the step of baking a laminate of green sheets into an integrated monolithic device.

While the invention has been described in detail and with reference to specific embodiments thereof, it will be apparent to one skilled in the art that various changes and modifications can be made therein without departing from the spirit and scope thereof.

What is claimed is:

1. A composite functional device comprising:
    a magnetic ceramic comprising a Ni—Zn ferrite; and
    a semiconductive comprising zinc oxide and at least one of nickel oxide and iron oxide in an amount of from about 0.001 to 0.1 mol % in terms of NiO or $Fe_2O_3$.

2. The composite functional device of claim 1 in which the semiconductive zinc oxide contains only NiO.

3. The composite functional device of claim 2 in which the semiconductive zinc oxide contains about 0.005 to 0.05 mol % NiO.

4. The composite functional device of claim 1 in which the semiconductive zinc oxide contains only $Fe_2O_3$.

5. The composite functional device of claim 4 in which the semiconductive zinc oxide contains about 0.005 to 0.05 mol % $Fe_2O_3$.

6. The composite functional device of claim 1 in which the semiconductive zinc oxide contains both NiO and $Fe_2O_3$.

7. The composite functional device of claim 6 in which the semiconductive zinc oxide contains about 0.005 to 0.5 mol % of the combination of NiO and $Fe_2O_3$.

8. A method for producing a composite functional device, comprising the steps of:
    providing a green sheet of magnetic material comprising a Ni—Zn ferrite;
    providing a green sheet of semiconductive material comprising zinc oxide and at least one of nickel oxide and iron oxide in an amount of from about 0.001 to 0.1 mol % in terms of NiO or $Fe_2O_3$;
    laminating said green sheet of a magnetic material and said green sheet of a semiconductive material; and
    firing said laminate.

9. The method of claim 8 in which the semiconductive zinc oxide contains only NiO.

10. The method of claim 9 in which the semiconductive zinc oxide contains 0.005 to 0.05 mol % NiO.

11. The method of claim 9 in which the semiconductive zinc oxide contains only $Fe_2O_3$.

12. The method of claim 11 in which the semiconductive zinc oxide contains 0.003 to 0.05 mol % $Fe_2O_3$.

13. The method of claim 9 in which the semiconductive zinc oxide contains both NiO and $Fe_2O_3$.

14. The method of claim 13 in which the semiconductive zinc oxide contains 0.005 to 0.5 mol % of the combination of NiO and $Fe_2O_3$.

15. The method of claim 9 including the step of preparing said green sheet of a magnetic material comprising a Ni—Zn ferrite.

16. The method of claim 15 including the step of preparing said green sheet of a semiconductive material comprising zinc oxide and at least one of nickel oxide and iron oxide in an amount of from about 0.001 to 0.1 mol % in terms of NiO or $Fe_2O_3$.

17. The method of claim 16 in which the semiconductive zinc oxide prepared contains 0.005 to 0.5 mol % of said at least one of NiO and $Fe_2O_3$.

18. The method of claim 9 including the step of preparing said green sheet of a semiconductive material comprising zinc oxide and at least one of nickel oxide and iron oxide in an amount of from about 0.001 to 0.1 mol % in terms of NiO or Fe2O$_3$.

19. The method of claim 18 in which the semiconductive zinc oxide prepared contains 0.005 to 0.5 mol % of said at least one of NiO and $Fe_2O_3$.

* * * * *